(12) United States Patent
Castex et al.

(10) Patent No.: US 9,004,135 B2
(45) Date of Patent: Apr. 14, 2015

(54) METHOD AND APPARATUS FOR BONDING TOGETHER TWO WAFERS BY MOLECULAR ADHESION

(75) Inventors: Arnaud Castex, Grenoble (FR); Marcel Broekaart, Theys (FR)

(73) Assignee: Soitec, Bernin (FR)

( * ) Notice: Subject to any disclaimer, the term of this patent is extended or adjusted under 35 U.S.C. 154(b) by 139 days.

(21) Appl. No.: 13/808,473

(22) PCT Filed: Jul. 15, 2011

(86) PCT No.: PCT/EP2011/062153
§ 371 (c)(1),
(2), (4) Date: Jan. 4, 2013

(87) PCT Pub. No.: WO2012/010517
PCT Pub. Date: Jan. 26, 2012

(65) Prior Publication Data
US 2013/0105061 A1   May 2, 2013

(30) Foreign Application Priority Data

Jul. 22, 2010 (FR) ...................................... 10 56010

(51) Int. Cl.
B32B 37/00 (2006.01)
H01L 21/67 (2006.01)
H01L 21/762 (2006.01)

(52) U.S. Cl.
CPC ...... *B32B 37/0084* (2013.01); *H01L 21/67092* (2013.01); *H01L 21/76251* (2013.01)

(58) Field of Classification Search
CPC ............ B32B 37/003; H01L 21/02002; H01L 21/67092

USPC ................... 156/381, 382, 497, 285; 438/455
See application file for complete search history.

(56) References Cited

U.S. PATENT DOCUMENTS

| 5,769,991 A | 6/1998 | Miyazawa et al. |
| 2005/0064680 A1 | 3/2005 | Thallner |

FOREIGN PATENT DOCUMENTS

| DE | 10048374 A1 | 4/2001 |
| EP | 2091071 A1 | 8/2009 |

OTHER PUBLICATIONS

International Search Report for International Application No. PCT/EP2011/062153 dated Oct. 4, 2011, 3 pages.
Written Opinion of the International Search Authority for International Application No. PCT/EP2011/062153, dated Oct. 4, 2011, 4 pages.
International Preliminary Report on Patentability, for International Application No. PCT/EP2011/062153, Jan. 22, 2013, 5 pages.

*Primary Examiner* — Philip Tucker
*Assistant Examiner* — John Blades
(74) *Attorney, Agent, or Firm* — TraskBritt

(57) ABSTRACT

The invention provides a method of bonding a first wafer onto a second wafer by molecular adhesion, the method comprising applying a point of initiation of a bonding wave between the first and second wafers, the method further comprising projecting a gas stream between the first wafer and the second wafer generally toward the point of initiation of the bonding wave while the bonding wave is propagating between the wafers. The invention also provides a bonding apparatus for carrying out the bonding method.

25 Claims, 4 Drawing Sheets

METHOD AND APPARATUS FOR BONDING TOGETHER TWO WAFERS BY MOLECULAR ADHESION

CROSS-REFERENCE TO RELATED APPLICATIONS

This application is a national phase entry under 35 U.S.C. §371 of International Patent Application PCT/EP2011/062153, filed Jul. 15, 2011, designating the United States of America and published in English as International Patent Publication WO 2012/010517 A1 on Jan. 26, 2012, which claims the benefit under Article 8 of the Patent Cooperation Treaty and under 35 U.S.C. §119(e) to French Patent Application Serial No. 1056010, filed Jul. 22, 2010, the disclosure of each of which is hereby incorporated herein by this reference in its entirety.

TECHNICAL FIELD

The present invention relates to the field of producing multilayer semiconductor structures (also known as composite structures or multilayer semiconductor wafers) produced by the transfer of at least one layer onto a final substrate. The layer transfer is obtained by bonding a first wafer (or initial substrate) onto a second wafer (or final substrate), for example, by molecular adhesion, the first wafer generally being thinned after bonding. The transferred layer may also comprise all or a portion of a component or a plurality of microcomponents.

More precisely, the present invention relates to the problem of bonding defects that may arise in a localized manner at the bonding interface between two wafers bonded by molecular adhesion.

BACKGROUND

Wafer bonding by molecular adhesion is a technique that is well known per se. It should be recalled that the principle of wafer bonding by molecular adhesion is based on bringing two surfaces into direct contact, i.e., without using a specific bonding material (adhesive, wax, solder, etc). Such an operation requires the surfaces that are to be bonded to be sufficiently smooth, and free of particles or of contamination, and for them to be sufficiently close together to allow contact to be initiated, typically at a distance of less than a few nanometers. The attractive forces between the two surfaces are then large enough to cause bonding by molecular adhesion or "direct bonding" (bonding induced by the various electronic interaction attractive forces (Van der Waals forces) between atoms or molecules of the two surfaces to be bonded together).

FIGS. 1A to 1D show an example of the production of a multilayer structure comprising wafer bonding by molecular adhesion of a first wafer 102 onto a second wafer 106 constituting a support wafer.

The first wafer 102 includes a series of microcomponents 104 on the bonding face 102a (FIG. 1A). The microcomponents 104 are formed by photolithography, employing a mask to define the zones for the formation of patterns corresponding to the microcomponents 104 to be produced.

The term "microcomponents" as used in this document means devices or any other patterns resulting from technical steps carried out on or in the layers and that need to be positioned accurately. Thus, they may be active or passive components, simple contact points, interconnections, etc.

Furthermore, the support wafer 106 is covered by a thermal or deposited oxide layer 108 formed by oxidation of the support wafer 106, for example, in order to facilitate bonding by molecular adhesion with the first wafer 102 (FIG. 1A).

Further, a treatment is generally carried out to prepare the bonding surface 102a of the first wafer 102 and the bonding surface 106a of the second wafer 106, the treatment varying as a function of the bonding energy to be obtained (chemical-mechanical polishing, cleaning, scrubbing, hydrophobic/hydrophilic treatment, etc).

Once the wafers have been prepared, the support wafer 106 is positioned in a bonding machine 115. More precisely, the support wafer 106 is positioned on the substrate carrier 110 of the bonding machine 115 with a view to assembling it with the first wafer 102 by direct bonding. The substrate carrier 110 holds the second wafer 106 in position by means of an electrostatic system or by suction, for example.

The first wafer 102 is then placed on the second wafer 106 in order to come into intimate contact therewith (FIG. 1B). Bonding by molecular adhesion is then initiated by applying a contact force (mechanical pressure) to the first wafer 102 (FIG. 1C). Application of this contact force enables initiating propagation of a bonding wave 122 from that initiation point (FIG. 1D). The bonding wave 122 is initiated by means of an application tool 114 (for example, a TEFLON® stylus) with which the bonding machine 115 is provided.

The term "bonding wave" in this document is used for the binding or molecular adhesion front that is propagated from the initiation point and that corresponds to the diffusion of attractive forces (Van der Waals forces) from the contact point over the entire area of intimate contact between the two wafers (bonding interface).

Propagation of the bonding wave 122 over the entire bonding surfaces 102a and 106a of the wafers 102 and 106, respectively, then allows wafer bonding by molecular adhesion of the two wafers, in order to obtain a multilayer structure 112.

Once bonding has been carried out, it can be reinforced by carrying out a thermal anneal. The first wafer 102 may then be thinned in order to form a transferred layer on the support wafer 106.

However, the presence of localized bonding defects 118 at the bonding interface between the two wafers 102 and 106 has been observed, and more precisely in a region 120 located remote from the bonding initiation point 116 (FIG. 1E). Those defects correspond to zones in which the two wafers 102 and 106 have a very weak bonding force or even a complete absence of bonding.

The manufacturer does not want such bonding defects since they reduce the quality of the bond between the wafers. More generally, those defects are evidence of a non-optimized fabrication process, which reduces the attraction of the multilayer structures produced.

Thus, there is currently a need to produce multilayer structures by wafer bonding by molecular adhesion that do not exhibit such bonding defects.

DISCLOSURE

To this end, the present invention proposes a method of bonding a first wafer onto a second wafer by molecular adhesion, the method comprising applying a point of initiation of a bonding wave between the first and second wafers, the method being characterized in that it further comprises projecting a gas stream between the first wafer and the second wafer toward the point of initiation of the bonding wave while the bonding wave is propagating between the wafers.

The invention acts mechanically to slow down the propagation of the bonding wave at the interface between the two wafers. Slowing down the bonding wave serves advantageously to reduce or to prevent the appearance of unwanted bonding defects at the bonding interface between the first and second wafers.

The invention can also serve advantageously to limit heterogeneous deformations being generated in the wafers while they are being bonded by direct bonding.

In a preferred embodiment, the gas stream is projected throughout the duration of propagation of the bonding wave between the wafers. It is then possible to optimize the effect of the above-described mechanical opposition.

In accordance with another aspect of the invention, the projected gas stream may be a stream of dry gas with water at a concentration of 10000 ppm (parts per million) or less in order to cause desorption of water over at least one of the bonding surfaces for the two wafers.

In a particular embodiment, the projected gas stream has water at a concentration of less than 1000 ppm.

A gas stream that is sufficiently dry (for example, having water at a concentration of less than 10000 ppm, or even less than 1000 ppm) is thus projected between the two wafers, thereby making it possible to trigger the desorption of water bound in the form of condensation on the bonding surfaces of the first wafer and/or the second wafer. Projecting a dry gas stream is also advantageous in that it can reduce the quantity of saturated water contained in the ambient air between the two wafers, thereby reducing the risk of water being adsorbed on the bonding surfaces of the two wafers in the form of condensation.

Further, the temperature of the gas stream may be in the range from the ambient temperature of the first and second wafers to 200° C.

More precisely, the temperature of the gas stream projected between the two wafers may be of the order of ambient temperature, i.e., the temperature of the working atmosphere, in order to prevent saturated water contained in the wafer surface environment from condensing and to prevent the wafers from deforming due to them expanding under the effect of temperature. Alternatively, the temperature of the projected gas stream may be above or below ambient temperature and up to 200° C., for example, in order to maximize the desorption effect.

Heating the gas stream projected between the two wafers is advantageous in that it means that its ability to desorb from the bonding surfaces of the two wafers can be augmented. A gas stream at such a temperature more easily triggers desorption of the water molecules close to the surfaces.

In a particular embodiment of the invention, the gas stream is selected from at least a stream of helium, argon, neon, nitrogen, carbon dioxide ($CO_2$), and a stream of air. The gas stream may, in particular, correspond to one of the gaseous elements or to any combination of some of the elements.

Further, the width of the gas stream may correspond to the diameter of the two wafers.

Such a stream width means that the formation of bonding defects can be limited or prevented over the entirety of the bonding interface between the two wafers.

The gas stream may also be a laminar flow.

The invention also envisages an apparatus for bonding by molecular adhesion a first wafer onto a second wafer, including means for applying a point of initiation of a bonding wave between the first and second wafers, the apparatus being characterized in that it further includes projection means configured to project a gas stream between the first and second wafer toward the point of initiation of the bonding wave while the bonding wave is propagating between the wafers.

The advantages and comments set out above with reference to the various implementations of the bonding method of the invention are analogously applicable to the various embodiments of the bonding apparatus of the invention.

In accordance with one aspect of the invention, the projection means of the bonding apparatus may be configured to project a gas stream that is dry, having water at a concentration of less than 10000 ppm, in order to cause desorption of water over at least one of the bonding surfaces of the two wafers.

In a particular embodiment, the projection means are configured such that the gas stream has water at a concentration of less than 1000 ppm.

Further, the projection means may be configured in order to project the gas stream at a temperature in the range from the ambient temperature of the first and second wafers to 200° C.

Furthermore, the gas stream projected between the two wafers may be selected from at least a stream of helium, argon, neon, nitrogen, carbon dioxide ($CO_2$), and a stream of air. In particular, the gas stream may correspond to one of the gaseous elements or to any combination of several of the elements.

Furthermore, the projection means may be configured such that the width of the gas stream corresponds to the diameter of the two wafers. In addition, the gas stream may be a laminar flow.

BRIEF DESCRIPTION OF THE DRAWINGS

Other characteristics and advantages of the present invention become apparent from the description below, made with reference to the accompanying drawings that illustrate an example of an embodiment and that is not limiting in any way. In the figures.

DETAILED DESCRIPTION

In general, the present invention relates to a method of bonding two wafers by molecular adhesion, the method being used to prevent the appearance of unwanted bonding defects at the bonding interface.

As indicated above, bonding defects have been observed appearing in a localized manner at the bonding interface of a multilayer structure formed by direct wafer bonding of a first wafer to a second wafer.

The wafers composing a multilayer structure are generally in the form of wafers that have a generally circular outline and that may have various diameters, especially diameters of 100 mm, 200 mm or 300 mm. However, the wafers may have any shape, such as a rectangular shape, for example.

Figure 1A:
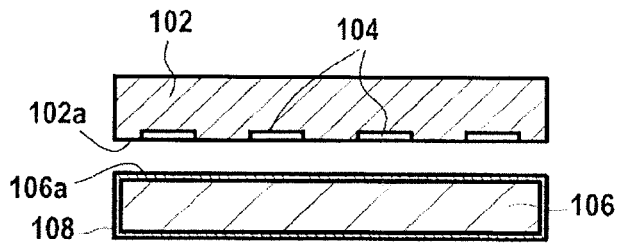
FIGS. 1A to 1D diagrammatically show an example of a known prior art direct wafer bonding method.
Figure 1B:
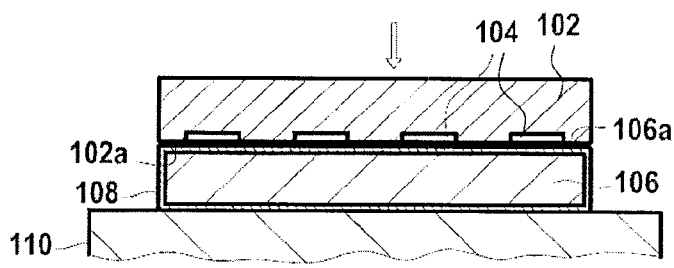
Figure 1C:
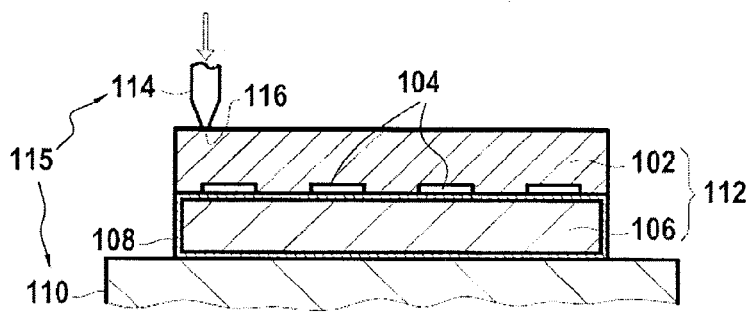
Figure 1D:
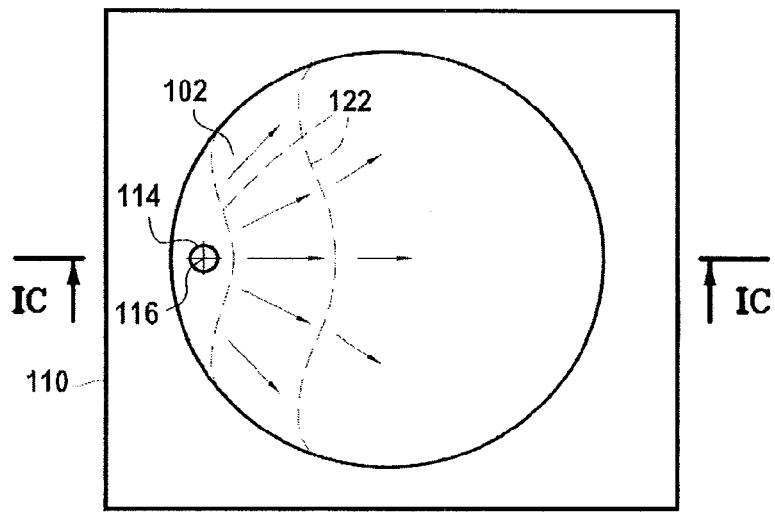
Figure 1E:
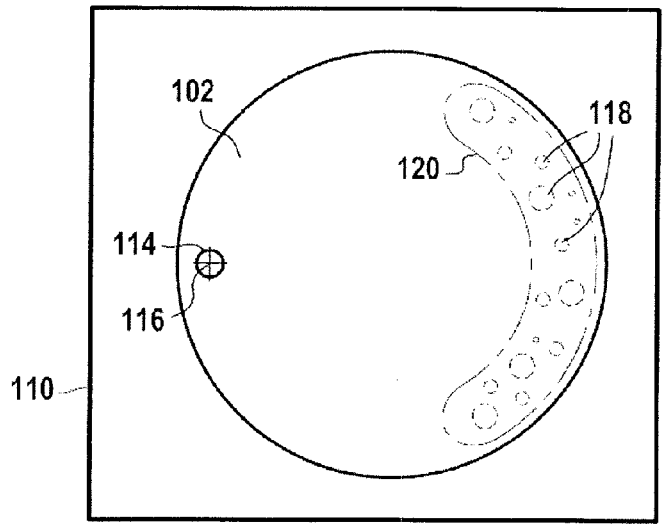
FIG. 1E diagrammatically shows the bonding defects appearing during the bonding method illustrated in FIGS. 1A to 1D.

An in-depth study of the bonding defects 118 illustrated in FIG. 1E has been used to elucidate the mechanism whereby the defects are formed and to devise a method to prevent their formation.

The mechanism at the origin of the defects 118 is described below with reference to FIGS. 1A to 1F.

As explained above, the initiation of wafer bonding by molecular adhesion is carried out by applying a contact force at an initiation point 116 located close to the side of the first wafer 102 (FIG. 1C). This contact force can be applied to initiate propagation of a bonding wave 122 starting from the initiation point 116 (FIG. 1D).

As the bonding wave 122 propagates, it pushes out the ambient air present between the two wafers together with excess water molecules adsorbed on the surface.

Figure 1F:
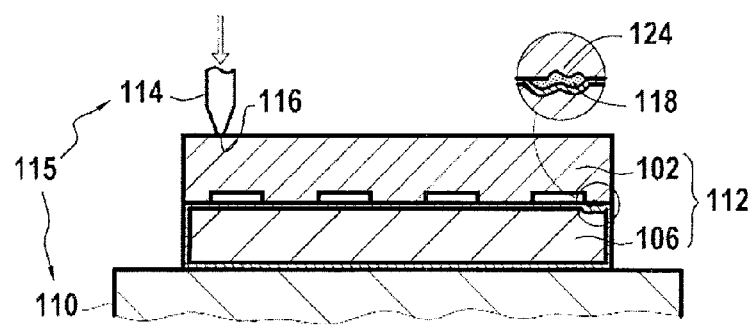
FIG. 1F diagrammatically illustrates the mechanism whereby the bonding defects represented in FIG. 1E are formed.

It appears that surface irregularities 124 (surface topology or nano-topology, fine particles, micro-scratches, etc.) may cause condensation at the irregularities of saturated water that is contained in the air being evacuated by the bonding wave 122 (FIG. 1F).

Hence, when the bonding wave 122 has propagated up to the point remote from the initiation point 116, an excess of water molecules may be found to be trapped in the form of condensation at the surface irregularities 124 such as, for example, in a region denoted 120 of the bonding surfaces 102a and 106a of the two wafers 102 and 106 (FIG. 1F).

The water that condenses at the surface irregularities 124 of the region 120 then prevents normal bonding of the two wafers by molecular adhesion. Bonding defects 118 then appear at the bonding interface, for example, at the surface irregularities 124. In practice, the bonding defects take the form of air bubbles (such as edge voids) that develop when a heat treatment is applied to reinforce the bonding energy.

Such defects are unwanted since they deteriorate the quality of the bond of the wafer 102 to the wafer 106. These bonding defects 118 may, in particular, cause accidental snap-off of portions of the wafer 102 in the vicinity of the defects 118 when the wafer 102 undergoes a thinning step (for example, by grinding and/or chemical attack).

To this end, the present invention proposes carrying out a method of wafer bonding by molecular adhesion involving projecting a gas stream between the two wafers that are to be assembled together, in order to prevent the appearance of bonding defects as described above, especially at the side of the wafer. Slowing down the bonding wave means that evacuation of excess water close to the surfaces can be facilitated.

A particular embodiment of the bonding method of the invention is described below with reference to FIGS. 2A to 2D.

Figure 2A:
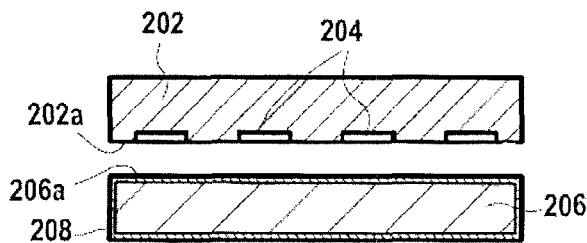
FIGS. 2A to 2D diagrammatically show a direct wafer bonding method in accordance with a first implementation of the invention.

Bonding by molecular adhesion of a first wafer 202 onto a second wafer 206 constituting a support wafer is carried out (FIG. 2A). These wafers are respectively identical to wafers 102 and 106 considered in FIG. 1A.

More precisely, the first wafer 202 in this example comprises microcomponents 204 at its bonding surface 202a. Further, oxidation is carried out on the second wafer 206 to form a layer of thermal oxide 208 over its entire surface. It should be noted that it is possible to deposit a layer of oxide on only the bonding surface 206a of the second wafer 206. Alternatively, a layer of oxide may be formed over the bonding surface 202a of the first wafer 202.

It should also be pointed out that the first and second wafers 202 and 206 have the same diameter in this instance. However, they could have different diameters or they could be non-circular in shape.

Furthermore, the wafers 202 and 206 may have surface irregularities at the side of the wafer analogous to the surface irregularities 124 illustrated in FIG. 1F.

In this implementation of the invention, first of all, the support wafer 206 is placed in a bonding machine 215, and more precisely on a substrate carrier 210 provided on the bonding machine 215. The machine 215 also comprises a nozzle 226 (described below) and an application tool 214 identical to the application tool 114 described above.

Figure 2B:
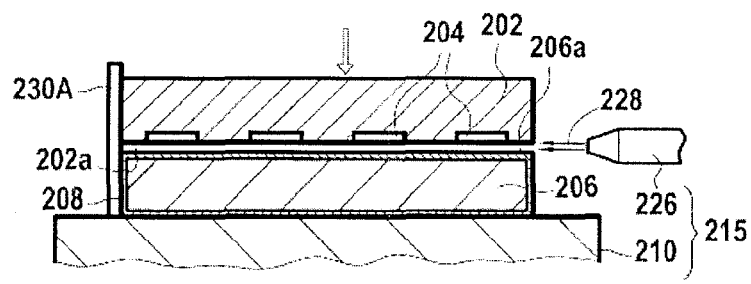

Once the support wafer 206 has been positioned on the substrate carrier 210, the first wafer 202 is placed in intimate contact with the support wafer 206 (FIG. 2B). A bonding wave 222 is then initiated between the wafers 202 and 206 in order to bond them by molecular adhesion.

Figure 2C:
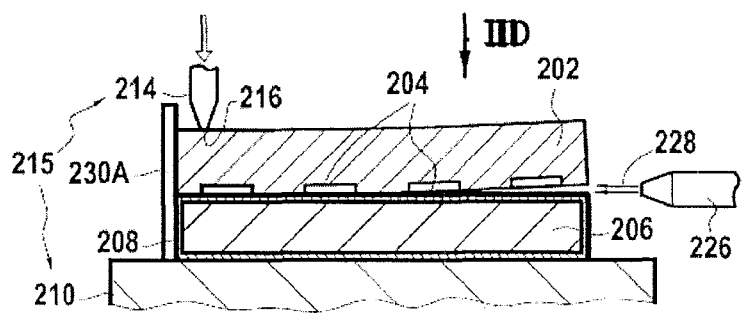

In this example, the wave 222 is initiated by using the application tool 214 to apply contact force at the initiation point 216 located in the vicinity of the side of the wafer 202 (FIG. 2C). Application of this contact force means that propagation of a bonding wave 222 from the initiation point 216 (FIG. 2D) can be triggered.

However, it should be noted that other operating modes can be used to initiate propagation of a bonding wave. Under certain conditions in particular, it is possible to trigger initiation of the wave propagation without applying mechanical pressure on the upper wafer 202.

Figure 2D:
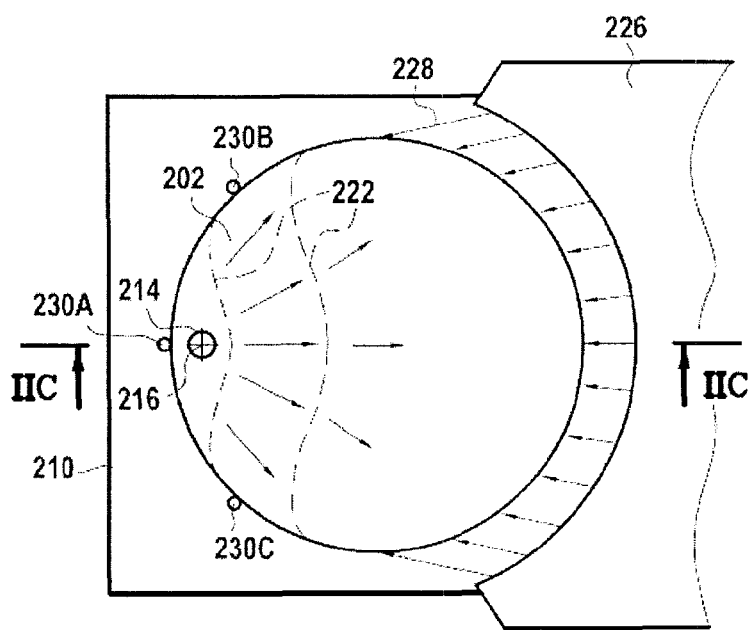

Once the bonding wave 222 has been initiated, a gas stream 228 is projected between the two wafers 202 and 206 by means of a nozzle 226 included in the bonding machine 215 (FIG. 2D). The gas stream 228 is then projected while the bonding wave 222 propagates between the two wafers 202 and 206.

Preferably, projection of the gas stream 228 is triggered simultaneously with initiation of the bonding wave 222. If necessary, projection of the gas stream 228 may be triggered a few moments before initiating the bonding wave 222.

Still preferably, projection of the gas stream 228 is maintained throughout the period for propagation of the bonding wave 222 between the wafers 202 and 206. In this manner, the mechanical braking effect described in more detail below is optimized.

It may be a stream of air or a stream of gas (or a gas mixture), for example, a stream of rare gas (helium, argon and/or neon, for example), a stream of nitrogen and/or a stream of carbon dioxide.

By way of example, the gas stream 228 is in the form of a very narrow jet (also known as a gas knife or air knife) capable of penetrating between the two wafers 202 and 206 in intimate contact. The flow cross-section of the nozzle 226 is preferably of the order of magnitude of the separation of the wafers 202 and 206, i.e., of the order of 10 μm, for example, and in any event less than the thickness of the wafers. The wafers 202 and 206 are approximately 500 μm thick, for example.

Further, in the example described here, the gas stream 228 is sufficiently wide to be capable of flushing the entirety of the bonding surfaces 202a and 206a of the wafers 202 and 206, respectively. However, as indicated in more detail below, other gas stream configurations may be envisaged.

Further, blocks 230A, 230B, and 230C (collectively denoted 230) attached to the substrate carrier 210 are positioned in abutment against the peripheral side of the wafers 202 and 206. These blocks are configured in order to prevent the position of the first wafer 202 from being offset from that of the support wafer 206 under the action of the gas stream 228.

However, it should be understood that other forms and dispositions of the blocks 230 are possible. As an example, the number of blocks may be reduced to two if necessary (or even to one if the shape of the block employed allows it).

Furthermore, the gas stream 228 is projected such that it is generally directed in the direction of the initiation point 216, preferably perpendicular to the bonding wave 222.

The gas stream 228 is preferably laminar so that the force applied to the surface of the wafers 202 and 206 is effective.

As can be seen in FIG. 2D, the nozzle 226 envisaged here has an inwardly curved profile such that the side thereof remains at a constant distance from the periphery of the wafers 202 and 206. This configuration for the nozzle 226 is advantageous in that it can be used to project the gas stream 228 in a direction generally perpendicular to the propagation of the bonding wave 222.

In the example considered here, the initiation point 216 is positioned close to the peripheral side of the first wafer 202. As indicated above, this configuration is preferred since it means that the bonding wave 222 can propagate over a large distance and, in the portion remote from the initiation point 216, it can form a zone that is almost without heterogeneous deformation. The initiation point 216 is then preferably positioned opposite from the nozzle 226.

However, it should be noted that it is possible to apply the contact force at any initiation point on the exposed surface of the first wafer 202.

The gas stream 228 is directed so as to mechanically brake the propagation of the bonding wave 222 between the wafers 202 and 206. By orienting the nozzle 226 toward the initiation point 216, the gas stream 228 in fact causes the application of a force that opposes the propagation of the bonding wave 222. The embodiment described here can effectively slow down propagation of the bonding wave 222 in a uniform manner over the entire bonding surface of the wafers 202 and 206. This slowdown is explained by the fact that the gas stream 228 applies mechanical pressure between the bonding surfaces 202a and 206a of wafers 202 and 206, respectively, the pressure thereby slowing down the approach of the wafers during the passage of the bonding wave 222 and allowing excess water to be evacuated.

The Applicant has shown that slowing down the propagation of the bonding wave means that the appearance of the bonding defects described above can be significantly reduced.

Slowing down of the bonding wave 222 also means that ambient air located between the two wafers 202 and 206 can be evacuated more effectively. In this manner, the saturated water contained in the air between the two wafers is less susceptible to condensing at the surface irregularities.

Typically, and when the invention is not applied, the bonding wave 222 takes about 8 to 10 seconds to propagate over the entirety of the bonding surfaces 202a and 206a when the wafers 202 and 206 have a diameter of 300 mm and when bonding oxide to oxide, or when one of the two wafers has been activated by plasma treatment. In contrast, when the invention is employed, the bonding wave 222 is slower; in the implementation considered here, the bonding wave 222 takes more than 10 seconds to propagate over the entirety of the bonding surfaces 202a and 206a. Nevertheless, the bonding wave propagation time varies as a function of the surface treatments carried out on the two wafers 202 and 206 to be assembled. In fact, the more hydrophilic the bonding surfaces 202a and 206a are, the higher will be the propagation rate of the bonding wave 222.

Furthermore, the gas stream 228 is preferably dry. As an example, it has water at a concentration of less than 10000 ppm, or even less than 1000 ppm.

The gas stream 228 projected between the two wafers 202 and 206 may be heated in order to increase its desorbing power. The higher the temperature of the gas stream 228 is, the more susceptible it is to cause evaporation of water trapped in the form of condensation at the surface irregularities. The gas stream 228 may be heated to a temperature that is preferably in the range from the ambient temperature of the environment of the two wafers 202 and 206 to 200° C.

Furthermore, as indicated above, bonding two wafers by molecular adhesion generates substantial mechanical stresses that are the source of heterogeneous deformations in the wafers. For example, if the wafer 202 is thinned after bonding and a second series of microcomponents is fabricated on the exposed face of the wafer 202 using a photolithography mask similar to that used to fabricate the first series of microcomponents 204, non-uniform overlays might appear between the two series of microcomponents due to the heterogeneous deformations brought about by the wafer bonding by molecular adhesion.

The term "similar photolithography masks" means masks that are designed to be used in combination during a fabrication process.

The slowing down of the propagation of the bonding wave that results from projecting a gas stream 228 during propagation advantageously serves to reduce the heterogeneous deformations that are generated during direct wafer bonding of the two wafers 202 and 206, thereby reducing the risks of overlays between the two faces of the first wafer 202. In addition, in order to reduce as many of the heterogeneous deformations as possible, the temperature of the gas stream 228 is preferably set at the ambient temperature of the wafers or at a temperature of the same order.

Figure 3A:
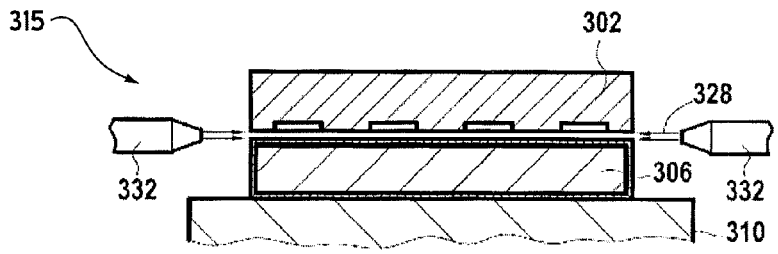
FIGS. 3A through 3C diagrammatically show a direct wafer bonding method in accordance with a second implementation of the invention.
Figure 3B:
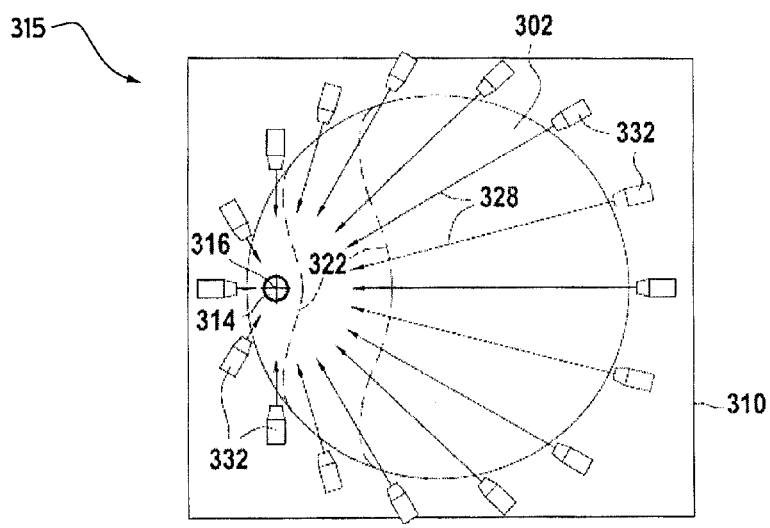
Figure 3C:
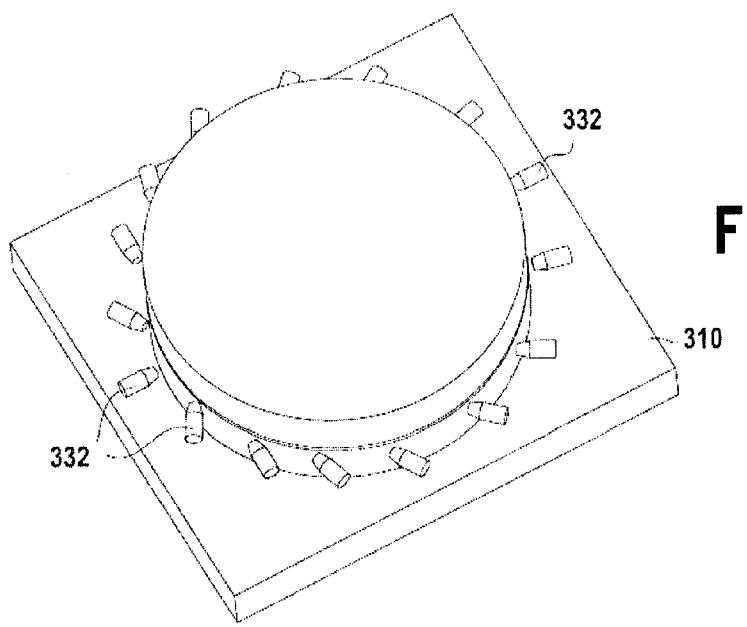

In accordance with a second implementation of the invention shown in FIGS. 3A, 3B and 3C, a first wafer 302 is bonded to a second wafer 306 by molecular adhesion. This implementation differs from the first implementation described above in that it is carried out using a bonding machine 315 that is substantially different from the bonding machine 215. More precisely, the bonding machine 315 comprises a substrate carrier 310 and an application tool 314 for applying a bonding initiation point to the first wafer 302. However, the bonding machine 315 differs from the bonding machine 215 in that it is also provided with a plurality of nozzles 332 all directed toward the bonding initiation point denoted 316.

The bonding machine 315 may also comprise a servo control to program the nozzles 332 and control the direction of projection of the gas streams 328 delivered by each of the nozzles 332. As an example, the bonding machine 315 is configured to detect, by means of a position sensor, the position of the initiation point 316 applied by the application tool 314. Once the position of the initiation point 316 has been determined, the bonding machine 315 orients the nozzles 332 so that each gas stream 328 is directed toward that initiation point or, as is preferable, in a direction perpendicular to the propagation of the wave. 322

In a manner analogous to the implementation of FIGS. 2A to 2D, the bonding machine of the second implementation is configured to project the gas stream between the wafers during propagation of the bonding wave. This second implementation can thus effectively and uniformly slow down propagation of the bonding wave at the interface between the two wafers and thus significantly reduce the appearance of bonding defects.

The invention claimed is:

1. A method of bonding a first wafer onto a second wafer by molecular adhesion, the method comprising:
    applying a point of initiation of a bonding wave between the first wafer and the second wafer using an initiation device;
    projecting a gas stream between the first wafer and the second wafer toward the point of initiation of the bonding wave while the bonding wave is propagating between the first wafer and the second wafer using a projection device including a plurality of nozzles each directed toward a common point;

using a control device to control directions of gas streams respectively projected from the nozzles of the plurality of nozzles; and using a sensor to detect a position of the point of initiation.

2. The method of claim 1, further comprising selecting the projected gas stream to comprise a stream of dry gas including water at a concentration of less than 10,000 ppm.

3. The method of claim 2, further comprising selecting the projected gas stream to comprise a stream of dry gas including water at a concentration of less than 1,000 ppm.

4. The method of claim 1, further comprising selecting the projected gas stream to comprise a stream having a temperature in a range extending from an ambient temperature of the first wafer and the second wafer to 200° C.

5. The method of claim 1, further comprising selecting the projected gas stream from the group consisting of a stream of argon, a stream of neon, a stream of helium, a stream of nitrogen, a stream of carbon dioxide, and a stream of air.

6. The method of claim 1, further comprising forming the projected gas steam to have a width corresponding to a diameter of the first wafer and a diameter of the second wafer.

7. The method of claim 1, further comprising applying the point of initiation of the bonding wave between the first wafer and the second wafer at a location close to a side of the first wafer.

8. The method of claim 7, further comprising applying the point of initiation of the bonding wave by applying a force to an exposed surface of the first wafer.

9. The method of claim 1, wherein projecting the gas stream between the first wafer and the second wafer toward the point of initiation of the bonding wave comprises slowing a rate of propagation of the bonding wave between the first wafer and the second wafer.

10. The method of claim 1, further comprising maintaining the projection of the gas stream throughout propagation of the bonding wave between the first wafer and the second wafer.

11. The method of claim 1, further comprising selecting at least one nozzle of the plurality of nozzles to have a flow cross-section dimension less than approximately 500 μm.

12. The method of claim 11, further comprising selecting the at least one nozzle to have a flow cross-section dimension on the order of 10 μm.

13. The method of claim 12, further comprising configuring the at least one nozzle such that a side of the at least one nozzle is located a constant distance from a periphery of the first wafer and the second wafer.

14. The method of claim 13, further comprising configuring the at least one nozzle such that the side of the at least one nozzle has an inwardly curved profile.

15. The method of claim 1, further comprising projecting the gas stream generally in a direction of the point of initiation of the bonding wave.

16. The method of claim 15, further comprising projecting the gas stream generally in a direction perpendicular to the bonding wave.

17. An apparatus for bonding a first wafer onto a second wafer by molecular adhesion, the apparatus comprising:

an initiation device configured to initiate a bonding wave at a point of initiation between the first wafer and the second wafer;

a projection device configured to project a gas stream between the first wafer and the second wafer toward the point of initiation of the bonding wave while the bonding wave is propagating between the first wafer and the second wafer, the projection device comprising a plurality of nozzles each directed toward a common point;

a control device configured to control directions of gas streams respectively projected from the nozzles of the plurality of nozzles; and a sensor configured to detect a position of the point of initiation.

18. The apparatus of claim 17, wherein the projection device is configured to project a stream of dry gas having water at a concentration of less than 10,000 ppm.

19. The apparatus of claim 17, wherein the projection device is configured to project the gas stream at a temperature in a range extending from an ambient temperature of the first wafer and the second wafer to 200° C.

20. The apparatus of claim 17, wherein the projected gas stream is selected from the group consisting of a stream of argon, a stream of neon, a stream of helium, a stream of nitrogen, a stream of carbon dioxide, and a stream of air.

21. The apparatus of claim 17, wherein the projection device is configured such that a width of the gas stream corresponds to a diameter of the first wafer and a diameter of the second wafer.

22. The apparatus of claim 17, wherein at least one nozzle of the plurality of nozzles has a flow cross-section dimension of less than approximately 500 μm.

23. The apparatus of claim 22, wherein the at least one nozzle has a flow cross-section dimension on the order of 10 μm.

24. The apparatus of claim 17, wherein a side of at least one nozzle of the plurality of nozzles is located a constant distance from a periphery of the first wafer and the second wafer.

25. The apparatus of claim 24, wherein the side of the at least one nozzle has an inwardly curved profile.

* * * * *